United States Patent
Kong et al.

(10) Patent No.: US 6,972,485 B2
(45) Date of Patent: Dec. 6, 2005

(54) FIXING DEVICE FOR FIXING BALL GRID ARRAY CHIP ON A SUBSTRATE WITHOUT SOLDERING

(75) Inventors: Hyung-Ho Kong, Seoul (KR); Sun-Gi Kim, Seoul (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/346,079

(22) Filed: Jan. 17, 2003

(65) Prior Publication Data

US 2003/0160336 A1 Aug. 28, 2003

(30) Foreign Application Priority Data

Feb. 22, 2002 (KR) ............................. 2002-9588

(51) Int. Cl.[7] ........................... H01L 23/12; H01L 23/34
(52) U.S. Cl. ....................... 257/704; 257/706; 257/712; 257/719
(58) Field of Search ................... 257/703, 704, 257/705, 706, 707, 708, 709, 710, 712, 717, 718, 719, 720, 727, 730, 778, 787

(56) References Cited

U.S. PATENT DOCUMENTS

| 5,783,461 | A | 7/1998 | Hembree |
| 6,052,287 | A | 4/2000 | Palmer et al. |
| 6,297,549 | B1 * | 10/2001 | Hiyoshi |
| 6,365,976 | B1 | 4/2002 | Carter, Jr. et al. |
| 6,365,980 | B1 | 4/2002 | Carter, Jr. et al. |
| 6,432,807 | B1 | 8/2002 | Tsukui et al. |
| 6,448,664 | B1 | 9/2002 | Tay et al. |
| 6,456,100 | B1 | 9/2002 | Hembree et al. |
| 6,545,552 | B2 * | 4/2003 | Kim et al. |

FOREIGN PATENT DOCUMENTS

JP          2000-82768          *  3/2000

* cited by examiner

Primary Examiner—Long Pham
Assistant Examiner—DiLinh Nguyen
(74) Attorney, Agent, or Firm—Robert E. Bushnell, Esq.

(57) ABSTRACT

The present invention relates to a ball grid array (BGA) chip-fixing device capable of easily fixing the ball grid array (BGA) chip on a printed circuit board (PCB). The device comprises: a fixing box fixed in place on a printed circuit board and having a through-hole; a ball grid array (BGA) chip for being settled within the through-hole of the fixing box to electrically connect with the printed circuit board; a heat sink layered on the upper face of the ball grid array (BGA) chip; a cover fixed over the fixing box; and a pressing unit provided on the underside of the cover for pressing the heat sink in a mounting direction of ball grid array (BGA) chip. The ball grid array (BGA) chip is fixed without soldering, the fixing and separation are simple since the assembly is made via simple screw-fastening, and the ball grid array (BGA) chip can be reused.

30 Claims, 2 Drawing Sheets

FIXING DEVICE FOR FIXING BALL GRID ARRAY CHIP ON A SUBSTRATE WITHOUT SOLDERING

CLAIM OF PRIORITY

This application makes reference to, incorporates the same herein, and claims all benefits accruing under 35 U.S.C. §119 from my application FIXING DEVICE FOR BALL GRID ARRAY CHIP filed with the Korean Industrial Property Office on 22 Feb. 2002 and there duly assigned Ser. No. 2002-9588.

BACKGROUND OF THE INVENTION

1. Technical Field

The present invention relates to a ball grid array (BGA) package, and more particularly, relates to a fixing device for a ball grid array chip capable of easily fixing the ball grid array chip on a printed circuit board (PCB) without using soldering in the mounting of the ball grid array chip on the printed circuit board.

2. Related Art

Various electronic communication instruments, such as a portable radio terminal, network communication equipment, and others, are being widely used. These instruments are being more commonly used due at least in part to the development of the communication industry. The functions of the instruments are getting diversified in order to meet desires of consumers. The general trend seems to be to reduce the size and weight of the instruments while increasing the capabilities of those instruments. One way to increase the capabilities of those instruments is to integrate many different features on each one of the printed circuit boards (PCBs) in those instruments. Also, it is desirable to utilize high-density integrated circuits.

A plurality of different components and devices can be mounted on a printed circuit board. A particular printed circuit board can be designed to facilitate a high degree of integration by allowing many different components and devices to be mounted on the printed circuit board.

For the purpose of reducing the size and for increasing the capabilities, as stated above, a printed circuit board should be reduced in size, and the desired integration of many different components should be considered when the printed circuit board is designed. Accordingly, chip-packaging techniques are being developed. Such chip-packaging techniques are getting diversified into a dip type, a plastic leaded chip carrier (PLCC) type, a surface mount device (SMD) type, a ball grid array (BGA) type, and others.

Among the above-mentioned chip-packaging techniques, the dip type, the plastic leaded chip carrier (PLCC) type, and the surface mount device (SMD) type allow the soldering status to be observed with a user's unaided eyes in mounting a chip to the printed circuit board. However, one possible disadvantage related to the ball grid array (BGA) type of chip-packaging technique is that the ball grid array (BGA) type does not allow for the above type of macroscopic observation.

The ball grid array (BGA) type chip is advantageous because it can reduce a volume by decreasing unnecessary packages with a die, and in particular, the ball grid array (BGA) type chip enables a high degree of integration by using only one face of the printed circuit board. However, another possible disadvantage related to the ball grid array (BGA) type of chip-packaging technique is that, since solder balls subject to bonding to the printed circuit board face are arranged under the chip, those solder balls are concealed during mounting, thereby making the bonding to the printed circuit board pad more difficult than other types of chip-packaging techniques.

Another possible disadvantage of the ball grid array (BGA) type chip-packaging technique is that some amount of lead might remain on the printed circuit board pad that exceeds a suitable amount of lead in soldering the ball grid array (BGA) chip, and that lead may adhere adjacent pins of the ball grid array (BGA) chip. A further disadvantage of the ball grid array (BGA) type chip-packaging technique is that, if the lead is less than the suitable amount, the ball grid array (BGA) pins are spaced from the printed circuit board pad thereby failing to form contacts.

Also, another possible disadvantage related to the ball grid array (BGA) type of chip-packaging technique is that the above operation requires expensive equipment and a long time period. Furthermore, additional equipment is required to remove the used ball grid array (BGA) chip, and the used ball grid array (BGA) chip cannot be reused.

It would be desirable to utilize a ball grid array (BGA) chip while avoiding some or all of the foregoing disadvantages associated the ball grid array (BGA) type of chip-packaging technique.

SUMMARY OF THE INVENTION

The present invention has been made to enable a ball grid array (BGA) chip to be utilized while avoiding some or all of the foregoing disadvantages associated with the ball grid array (BGA) type of chip-packaging technique. The present invention provides a fixing device for ball grid array (BGA) chip capable of fixing the ball grid array (BGA) chip on a printed circuit board without soldering. In other words, the present invention provides a device that can secure a ball grid array (BGA) chip on a printed circuit board without soldering.

The present invention provides a fixing device for a ball array (BGA) chip capable of electrically connecting the ball grid array (BGA) chip on a printed circuit board in an easy manner and then fixing the ball grid array (BGA) chip in that position.

The present invention provides a fixing device for a ball grid array (BGA) chip which can be reused after removal from the printed circuit board pad.

According to an aspect of the present invention, the present invention provides a ball grid array (BGA) chip-fixing device, the device comprising: a fixing box fixed in place on a printed circuit board and having a through-hole; a ball grid array (BGA) chip for being settled within the through-hole of the fixing box to electrically connect with the printed circuit board; a heat sink layered on the upper face of the ball grid array (BGA) chip; a cover fixed over the fixing box; and pressing means provided in the underside of the cover for pressing the heat sink in a mounting direction of ball grid array (BGA) chip.

Therefore, since the fixing box is fixed in place on the printed circuit board and the ball grid array (BGA) chip is fixed on the through-hole, an additional soldering operation is omitted. In this case, pins of the ball grid array (BGA) chip can be electrically connected with a pattern on the printed circuit board in a suitable manner.

Further, the ball grid array (BGA) chip can be fixedly positioned by chip supports which are separately installed within the fixing box, and the chip supports can be inserted with suitable sizes according to the size of the ball grid array (BGA) chip mounted in the fixing box.

The cover can be provided with a plurality of openings for efficiently radiating heat transferred from the heat sink within a range which does not spatially restrict the pressing means installed in the underside of the cover.

Although the pressing means include at least one leaf spring, other coil springs can be utilized also. It is efficient that the pressing means contact the upper face of the heat sink to the maximum extent since this structure can rapidly conduct heat radiated from the heat sink outside the cover.

The fixing box is preferably fixed on the printed circuit board with a number of screws, and the cover is preferably fixed to the fixing box by fastening a number of screws. This is aimed toward facilitating the separation of the fixing device and simplifying the reuse of the ball grid array (BGA) chip. The fixing box, cover, and the device support can be formed of a metallic material for raising heat conductivity, and are preferably formed of aluminum, stainless steel, or other metallic material.

In accordance with the principles of the present invention, as embodied and broadly described, the present invention provides an apparatus, comprising: a cover support secured to a substrate; a device adjacent to said cover support, said device being electrically connected to the substrate; a cover secured to said cover support; and at least one pressing unit pressing said device toward the substrate when said cover is secured to said cover support, said at least one pressing unit being positioned between said cover and said device, said device being positioned between the substrate and said at least one pressing unit.

In accordance with the principles of the present invention, as embodied and broadly described, the present invention provides an apparatus securing a device to a substrate without soldering, comprising: a cover support removably secured to a substrate and having a plurality of walls corresponding to an outer perimeter of said cover support; a device positioned at least partly inside the outer perimeter of said cover support and electrically connected to the substrate; a heat sink contacting said device and dissipating heat from said device; a cover secured to said cover support; and at least one pressing unit disposed between said cover and said heat sink when said cover is secured to said cover support, said at least one pressing unit pressing said heat sink to said device when said cover is secured to said cover support, said device being positioned between the substrate and said heat sink.

In accordance with the principles of the present invention, as embodied and broadly described, the present invention provides an apparatus securing a device to a printed circuit board without soldering, comprising: a cover support removably secured to a printed circuit board and having a plurality of walls corresponding to an outer perimeter of said cover support; a device positioned inside the outer perimeter of said cover support and electrically connected to the printed circuit board; a heat sink contacting said device and dissipating heat from said device; a cover secured to said cover support; and at least one pressing unit disposed between said cover and said heat sink when said cover is secured to said cover support, said at least one pressing unit pressing said heat sink to said device when said cover is secured to said cover support, said device being positioned between the printed circuit board and said heat sink.

The present invention is more specifically described in the following paragraphs by reference to the drawings attached only by way of example. Other advantages and features will become apparent from the following description and from the claims.

BRIEF DESCRIPTION OF THE DRAWINGS

In the accompanying drawings, which are incorporated in and constitute a part of this specification, embodiments of the invention are illustrated, which, together with a general description of the invention given above, and the detailed description given below, serve to exemplify the principles of this invention.

DESCRIPTION OF EMBODIMENTS FOR CARRYING OUT THE INVENTION

While the present invention will be described more fully hereinafter with reference to the accompanying drawings, in which details of the present invention are shown, it is to be understood at the outset of the description which follows that persons of skill in the appropriate arts may modify the invention here described while still achieving the favorable results of this invention. Accordingly, the description which follows is to be understood as being a broad, teaching disclosure directed to persons of skill in the appropriate arts, and not as limiting upon the present invention.

Illustrative embodiments of the invention are described below. In the interest of clarity, not all features of an actual implementation are described. In the following description, well-known functions, constructions, and configurations are not described in detail since they could obscure the invention with unnecessary detail. It will be appreciated that in the development of any actual embodiment numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill having the benefit of this disclosure.

In view of the foregoing, it is apparent that there are advantages and disadvantages associated with the ball grid array (BGA) type of chip-packaging technique. Exemplars of recent efforts pertaining to the ball grid array (BGA) type of chip-packaging technique are disclosed, for example, in U.S. Pat. No. 6,456,100 to Hembree et al., entitled APPARATUS FOR ATTACHING TO A SEMICONDUCTOR, issued on Sep. 24, 2002, U.S. Pat. No. 6,448,664 to Tay et al., entitled BALL GRID ARRAY CHIP PACKAGES HAVING IMPROVED TESTING AND STACKING CHARACTERISTICS, issued on Sep. 10, 2002, U.S. Pat. No. 6,432,807 to Tsukui et al., entitled METHOD OF FORMING SOLDER BUMPS ON A SEMICONDUCTOR DEVICE USING BUMP TRANSFER PLATE, issued on Aug. 13, 2002, U.S. Pat. No. 6,365,980 to Carter Jr. et al., entitled THERMALLY ENHANCED SEMICONDUCTOR BALL GRID ARRAY DEVICE AND METHOD OF FABRICATION, issued on Apr. 2, 2002, U.S. Pat. No. 6,365,976 to Carter Jr et al., entitled INTEGRATED CIRCUIT DEVICE KITH DEPRESSIONS FOR RECEIVING SOLDER BALLS AND METHOD OF FABRICATION, issued on Apr. 2, 2002, and U.S. Pat. No. 6,052,287 to Palmer et al., entitled SILICON BALL GRID ARRAY CHIP CARRIER, issued on Apr. 18, 2000.

While these contemporary efforts contain merit, it is believed that further improvements can also be contemplated.

Figure 1:
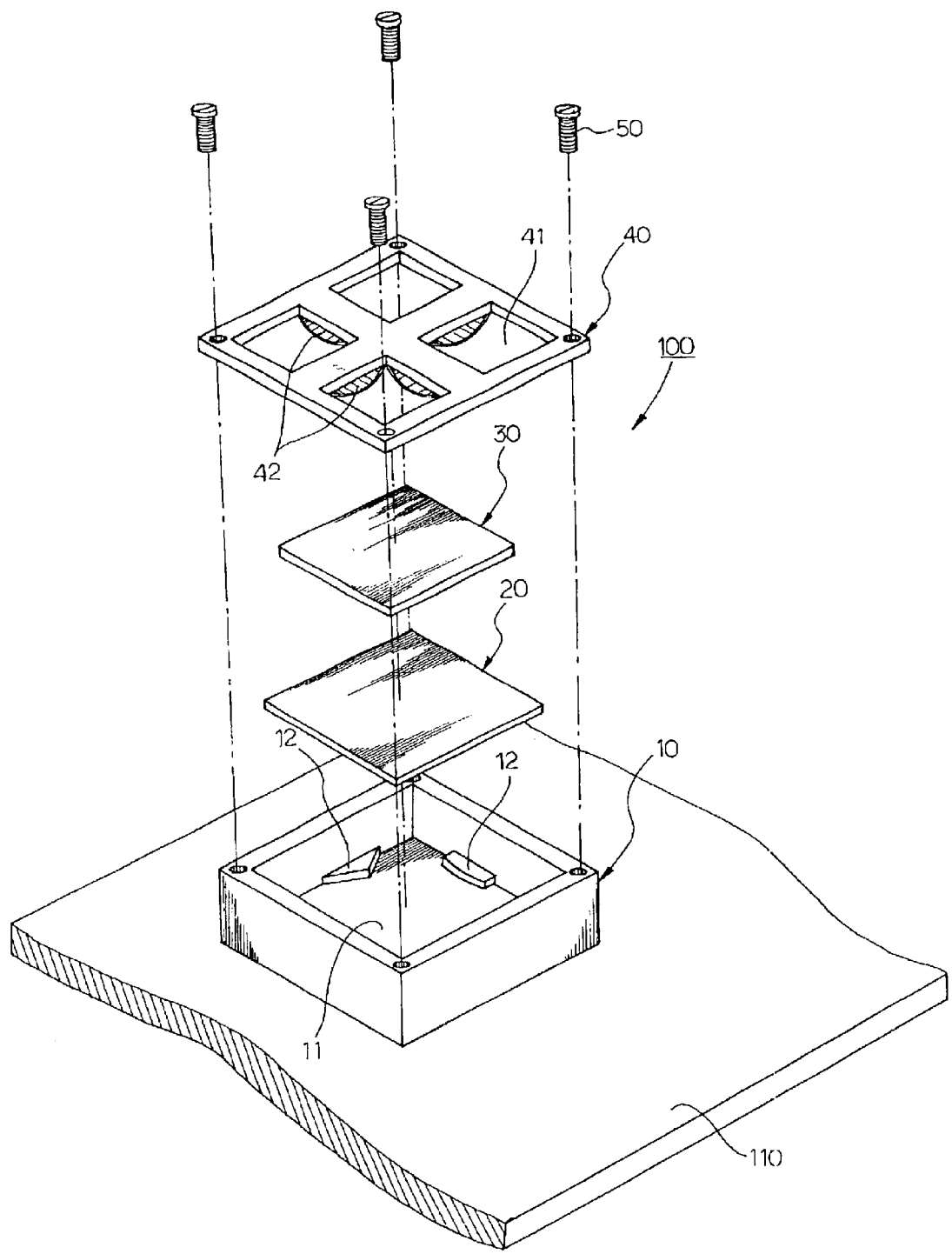
FIG. 1 is a perspective exploded view illustrating a first embodiment of a fixing device for a ball grid array (BGA) chip, in accordance with the principles of the present invention.

FIG. 1 is a perspective exploded view illustrating a first embodiment of a fixing device for a ball grid array (BGA) chip, in accordance with the principles of the present invention. As shown in FIG. 1, the ball grid array (BGA) chip-fixing device 100 has a fixing box 10 fixed in place on a substrate or printed circuit board 110, a ball grid array (BGA) chip 20 placed in the fixing box 10, a heat sink 30 placed over the ball grid array (BGA) chip 20, a cover 40 placed over the heat sink 30 and fixed to the fixing box 10 and pressing means installed under the cover for pressing the heat sink 30. The pressing means can include one or more leaf springs 42. The pressing means can include at least one pressing unit. One of the leaf springs 42 could be referred to as a pressing unit, for example. The pressing means 42 can be optionally referred to as a pressing unit 42.

Devices can be mounted onto a printed circuit board. Some of such devices can be described as integrated circuits, semiconductors, chips, microprocessors, or central processing units (CPUs), for example. The ball grid array chip 20 is one such device mounted on the substrate 110.

One example of such a substrate 110 is the printed circuit board. The substrate 110 can have conductive patterns. When the substrate 110 is a printed circuit board, the conductive patterns of the printed circuit board 110 can be used to establish electrical connections to devices mounted on the printed circuit board 110. Typically, contacts or terminals of a device are electrically connected to the conductive patterns of a printed circuit board when the device is mounted to the printed circuit board. When a chip is said to be electrically connected to a printed circuit board, this often means that the chip is electrically connected to at least some of the conductive patterns of the printed circuit board.

The fixing box 10 can also be referred to as a cover support 10. The fixing box 10 directly supports the cover 40 when the cover 40 is installed at the top region of the fixing box 10. The fixing box 10 indirectly supports the leaf springs 42 when the cover 40 is mounted onto the fixing box 10 because the leaf springs 42 are mounted to the underside of the cover 40.

Figure 2:
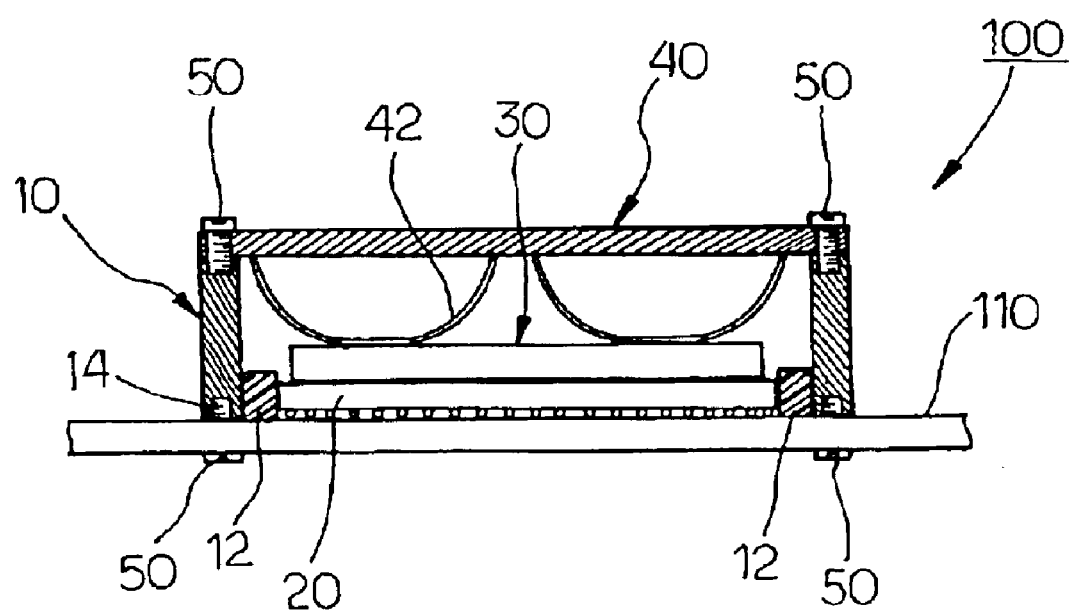
FIG. 2 is a perspective assembly view illustrating the first embodiment of the fixing device for the ball grid array (BGA) chip, in accordance with the principles of the present invention.

The fixing box 10 can also be referred to as an enclosure 10. The fixing box 10 can be said to at least partly enclose the ball grid array chip 20 or at least partly surround the ball grid array chip 20, after the ball grid array chip is placed inside the hole 11 of the fixing box 10. The fixing box 10 is shown to have four side walls in FIG. 1. As shown in FIGS. 1 and 2, the four side walls form a type of outer perimeter border region, and the device 20 is placed inside that outer perimeter border region. The device 20 is placed within the outer perimeter formed by the four side walls of the fixing box 10.

The four side walls of the fixing box 10 have a lower edge that is at least partly in contact with the substrate 110 when the fixing box 10 is secured to the substrate 110, as shown in FIGS. 1 and 2. The device supports 12 contact a portion of the fixing box 10 when the device supports 12 are on the substrate 110. The four side walls of the fixing box 10 have an upper edge that is at least partly in contact with the cover 40 when the cover 40 is secured to the fixing box 10, as shown in FIG. 2. In the embodiment shown in FIGS. 1 and 2, the cover 40 is secured to the upper edge of the fixing box 10 using screws 50.

As depicted in FIGS. 1 and 2, the fixing box 10 is designed so that the upper edge of the four walls is approximately a straight edge. When the fixing box 10 is designed so that the upper edge of the four walls is not a straight edge, the cover 40 will not contact every portion of the upper edge of the four walls of the fixing box 10 when the cover 40 is secured to the fixing box 10. This non-straight upper edge of the fixing box 10 is consistent with the principles of the present invention because the removable cover 40, the pressing means 42, the device supports 12, and the fixing box 10 still work together to secure the device 20 to the substrate 110 without soldering. Other changes can be made to the size, shape, and dimensions of the fixing box 10, so that the fixing box 10 will not need to appear exactly as shown in FIGS. 1 and 2, as long as the removable cover 40, the pressing means 42, the device supports 12, and the fixing box 10 still work together to secure the device 20 to the substrate 110 without soldering.

If the pressing unit 42 is not soldered to the top of the heat sink 30, then the device 20 can be removed and a different device 20 can be placed into electrical contact with the substrate 110. However, even if the pressing unit 42 is soldered to the top of the heat sink 30, then the device 20 can still be removed and a different device 20 can be placed into electrical contact with the substrate 110 because the heat sink 30 is not permanently affixed to the device 20. The embodiment shown in FIGS. 1 and 2 shows that no soldering is required during the assembly of the following different components with each other: connecting the substrate 110 to the fixing box 10; placing the device 20 into electrical contact with the substrate 110 at a position adjacent to the fixing box 10; placing the heat sink 30 onto the device 20; and connecting the cover 40 to the fixing box 10 with the pressing unit 42 arranged to press the heat sink 30 to the device 20 and thereby hold the device 20 in the correct electrical contact with the substrate 110.

The pressing unit 42 may be secured to the bottom side of the cover 40 by various means. The principles of the present invention do not in any way limit the methods of securing the pressing unit 42 to the cover 40. For example, it would be possible to solder the pressing unit 42 to the cover 40 or to secure the pressing unit 42 to the cover 40 using screws. If the pressing unit is permanently secured to the cover 40 using soldering or other methods, that does not change the principle that the device 20 is secured to the substrate 110 without soldering, because the securing of the pressing unit 42 to the cover 40 is a peripheral matter. The present invention provides an apparatus and method allowing a device 20 to be electrically connected to a substrate 110 without using solder to connect the device 20 to the substrate 110. Also, the present invention provides an apparatus and method allowing a device 20 to be repeatedly removed and installed without using solder to connect the device 20 to the substrate 110, and allowing a device 20 to be replaced by a differently-sized device 20 without using solder to connect the device 20 to the substrate 110.

The pressing unit 42 does not need to be secured to the cover 40. The pressing unit 42 could be merely placed on top of the heat sink 30, and then the cover 40 could be secured to the fixing box 10. Thus, the pressing unit 42 can be held in place by being squeezed between the cover 40 and the heat sink 30. The pressing unit 42 can also be described as an elastic means.

In the fixing box 10 of the first embodiment shown in FIGS. 1 and 2, the size, shape, and dimensions of the fixing box 10 can be modified to be different from the sample fixing box 10 shown in FIGS. 1 and 2. The hole 11 formed by the fixing box 10 can also be referred to as an aperture 11. The fixing box 10 can have additional apertures in one or more of the four side walls to facilitate ventilation and dissipation of heat, to help the ball grid array chip 20 avoid overheating. The additional apertures in one or more of the side walls of the fixing box 10 are not shown in FIGS. 1 and 2.

The fixing box 10 has four sides, as shown in FIG. 1. In the first embodiment shown in FIGS. 1 and 2, the fixing box 10 does not have a permanently mounted top side and does not have a permanently mounted bottom side. The top area of the fixing box 10 is open to form the through hole 11 or aperture 11. The bottom area of the fixing box 10 is open to allow the ball grid array chip 20 to contact the printed circuit board 110. Accordingly, the fixing box 10 is a four sided box and not a six sided box.

The fixing box 10 is provided with a through hole 110 which is open to show a face of the printed circuit board 110. The fixing box 10 can be provided in various shapes according to the configuration of the ball grid array (BGA) chip 20 subject to mounting. Preferably, the fixing box 10 can be rectangle-shaped. Further, the fixing box 10 can be positioned to surround a portion of the printed circuit board where the ball grid array (BGA) chip 20 will be installed. The four side walls of the fixing box 10 can be formed to be perforated by a number of apertures, to facilitate dissipation of heat or for other reasons.

In a second embodiment, not shown, the four side walls of the fixing box 10 can be replaced with four poles. The four poles are arranged to receive the four screws 50 to secure the cover 40 to the four poles. Also, the four poles are arranged to receive four screws 50 to secure the four poles to the printed circuit board 110, similar to the way in which the fixing box 10 receives screws 50 to secure the fixing box 10 to the printed circuit board 110 as shown in FIG. 2. That is, the four side walls of the fixing box 10 shown in FIG. 1 can be removed and four poles can be installed, each respective pole being located at a position corresponding to one of the four corners of the fixing box 10 shown in FIG. 1, so that the screws 50 and the cover 40 can be used in the same manner as shown in FIGS. 1 and 2. Thus, in this second embodiment, the fixing box 10 will not have the four sides shown in FIG. 1, but will instead include four poles. In this second embodiment, with the four-pole structure, the term "fixing box 10" would be replaced by the term introduced above: "cover support 10." The four-pole structure of the second embodiment is not shown in FIGS. 1 and 2.

In the first embodiment shown in FIGS. 1 and 2, the term "cover support 10" can be used to represent the "fixing box 10" as shown in FIGS. 1 and 2 because the fixing box 10 actually does support the cover 10. In the aforementioned second embodiment, not shown, which has the four poles instead of the four walls of the fixing unit 10, the same term "cover support 10" can be used to represent the four-pole structure supporting the cover 40, because the four-pole structure actually does support the cover 40.

In the second embodiment described above, the four poles of the cover support 10 could be connected to each other, but would not be required to be connected to each other. When the four poles of the cover support 10 of the second embodiment are formed to be connected to each other when mounted to the substrate 110, the four connected poles together are considered to be a single cover support 10. On the contrary, when the four poles of the cover support 10 of the second embodiment are not connected to each other when mounted to the substrate 110, each one of the separate portions is considered to be a separate cover support 10, so there will therefore be more than one cover support 10 in this circumstance. In other words, when the four poles of the cover support 10 of the second embodiment are not connected to each other when mounted on the substrate 110, there will be more than one cover support 10 supporting the cover 40.

In a third embodiment, the four poles of the cover support 10 could be replaced with three poles, one at each of three of the four corners of the cover 40, and the three poles could be connected to each other but would not be required to be connected to each other. In the third embodiment, the cover support 10 is made up of a three-pole arrangement.

In the third embodiment described above, the three poles of the cover support 10 could be connected to each other, but would not be required to be connected to each other. When the three poles of the cover support 10 of the third embodiment are formed to be connected to each other when mounted to the substrate 110, the three connected poles together are considered to be a single cover support 10. On the contrary, when the three poles of the cover support 10 of the third embodiment are not connected to each other when mounted to the substrate 110, each one of the separate portions is considered to be a separate cover support 10, so there will therefore be more than one cover support 10 in this circumstance. In other words, when the three poles of the cover support 10 of the third embodiment are not connected to each other when mounted on the substrate 110, there will be more than one cover support 10 supporting the cover 40.

FIG. 2 is a perspective assembly view illustrating the first embodiment of the fixing device for the ball grid array (BGA) chip in accordance with the principles of the present invention. As shown in FIG. 2, the fixing box 10 can be fastened to substrate 110 with a plurality of screws 50. Therefore, at four lower corners of the fixing box 10, screw-fastening holes 14 are provided.

The cover 40 is finally assembled to the fixing box 10, and preferably can be fixed on the fixing box 10 by the plurality of screws 50. Therefore, the cover 40 is provided at four corners with screw through-holes through which the screws 50 can extend. In four upper corners of the fixing box 40, screw-fastening holes corresponding to the through-holes, can be provided.

The cover 40 is constructed to readily radiate heat from the heat sink 30 to the outside, for which a number of openings 41 can be preferably provided in the cover 40. The cover 40, the fixing box 10 and the device supports 12 can be formed of a metallic material, and the screw-fastening holes of the fixing box 10 and the screw through-holes of the cover 40 can be formed when the cover 40 and the fixing box 10 are formed.

As shown in FIGS. 1 and 2, additional supports 12 are provided for fixing the position of the ball grid array (BGA) chip 20 within the fixing box 10. The additional supports 12 are also referred to as chip supports 12 and as device supports 12. The chip supports 12 help to align the ball grid array chip 20 so that the chip 20 can be properly electrically connected with the correct, appropriate, portions of the printed circuit board 110.

The device supports 12 can be formed of a metallic material or an equivalent thereof for enhanced heat conductivity. The chip supports 12 can be attached to the fixing box 10 and can be detached from the fixing box 10. The chip supports 12 can be positioned to be only next to the ball grid array chip 20, or can be positioned to be only under the ball grid array chip 20. Also, the chip supports 12 can be shaped to have an "L" shape so that the chip supports 12 can be positioned to be simultaneously under an edge of the ball grid array chip 20 and next to the edge of the ball grid array chip 20.

The chip supports 12 function to position the chip 20 so that the electrically connected status between pins of the ball grid array (BGA) chip 20 and a pattern on the printed circuit board 110 is maintained. As shown in FIG. 1, the chip supports 12 are not utilized as conductors. Instead, the chip supports 12 are used as blocks to fit between the fixing box 10 and the chip 20. The chip supports 12 can abut the fixing box 10 and can abut the chip 20 to ensure that the chip 20 is properly aligned on the printed circuit board 110. Also, the chip supports 12 can be in their shapes and sizes according to the shape and size according to the shape and size of the ball grid array (BGA) chip 20 being mounted. Therefore, this process is very efficient since only the chip supports 12 are replaced according to the size and shape of the ball grid array (BGA) chip 20 applied to the fixing box 10, without varying the size of the fixing box 10. The chip supports 12 can be shaped and sized to fit snugly into an interior corner of the fixing box 10 where the fixing box 10 meets the substrate 110, or the chip supports 12 can be shaped and sized to abut a middle section of one of the four walls of the fixing box 10 instead of fitting into a corner of the fixing box 10. The chip supports 12 can be formed in many different shapes and sizes, as long as the chip supports 12 fit between the fixing box 10 and the chip 20 for the proper alignment of the chip 20.

In the second embodiment discussed above, but not shown in a drawing, the chip supports 12 would be placed to abut one or more of the four poles to align the chip 20 on the printed circuit board 110. In the third embodiment discussed above, but not shown in a drawing, the chip supports 12 would be placed to abut one or more of the three poles to align the chip 20 on the printed circuit board 110. In the second and third embodiments, the chip supports 12 can be shaped to at least partially receive one or more of the poles or to fit with one or more of the poles, so that the chip supports 12 will stay in place and will properly align the chip 20.

The pressing unit can include a number of leaf springs 42 installed on the underside of the cover 40. The leaf springs 42 installed as above contact the upper face of the heat sink 30 and press the heat sink 30 in a direction of mounting the ball grid array (BGA) chip 20. Specifically, each one of the leaf springs 42 can be provided on a face portion through each of the openings 41, and has the configuration of an arc with both ends being fixed to the face of the cover 40 and a center thereof being projected downward.

Therefore, when the cover 40 is mounted to the fixing box 10, central portions of the arc-shaped leaf springs 42 are pushed into certain shapes to press the heat sink 30 with a certain amount of pressing force. In this case, the openings 41 of the cover 40 can be formed within a range which does not interfere with the operation of the leaf springs 42 installed on the underside of the cover 40. Therefore, the leaf springs 42 used as the pressing unit 42 not only press the heat sink 30, but also function to conduct heat radiated from the heat sink 30. The pressing unit 42 can be leaf springs 42 or can be other types of pressing units.

FIG. 2 is a perspective assembly view illustrating a fixing device for a ball grid array (BGA) chip in accordance with the principles of the present invention. FIG. 2 can be described as a longitudinal sectional view illustrating the assembled posture of the ball grid array (BGA) chip-fixing device in accordance with the principles of the invention. Referring to an order of mounting the fixing device 100, the fixing box 10 is primarily fixed to the printed circuit board (PCB) 110 with the screws 50.

Then the ball grid array (BGA) chip 20 is settled within the fixing box 10, followed by fixing the position of the ball grid array (BGA) chip 20 with the chip supports 12. In this case, the chip supports 12 function to maintain the electrical connection between the pins of the ball grid array (BGA) chip 20 and the pattern on the printed circuit board (PCB) 110. Then, the cover 40 is put over the heat sink 30 after the heat sink 30 is placed over the ball grid array (BGA) chip 20. As shown in FIG. 2, the cover 40 is fastened with the screws 50, and upon completion of fastening, the leaf springs 42 installed on the underside of the cover 40 are pressed downward so as to contact the upper face of the heat sink 30, thereby completing the assembly.

If it is necessary to separate the ball grid array (BGA) chip 20, the ball grid array (BGA) chip 20 can be simply separated from the printed circuit board (PCB) 110 by performing the above process in reverse order.

The ball grid array (BGA) chip-fixing device 100 of the invention is assembled through simple screw-fastening without soldering in fixing the ball grid array (BGA) chip, so that the ball grid array (BGA) chip can be simply fixed and separated, as well as reused.

The foregoing description of the embodiment shown in FIGS. 1 and 2 shows a method of temporarily securing a cover 40 to the fixing box 10 using screws 50, and shows a method of temporarily securing the fixing box 10 to the printed circuit board 110 using screws 50. Alternative methods can be used to temporarily secure the cover 40 to the fixing box 10, and to temporarily secure the fixing box 10 to the printed circuit board 110, without the use of the screws 50. Also, the cover 40 can be permanently secured to the fixing box 10 instead of being temporarily secured to the fixing box 10, if desired. Additionally, the fixing box 10 can be permanently secured to the printed circuit board 110 instead of being temporarily secured to the printed circuit board 110, if desired.

The fixing box 10 can have less than four sides, to facilitate ventilation and cooling of the ball grid array chip 20. The four sides of the fixing box 10, as shown in FIG. 1, can have apertures to facilitate ventilation and cooling of the ball grid array chip 20. If a heat sink 30 is not needed or desired, the heat sink 30 can be omitted to allow the leaf springs 42 to press directly down onto the top surface of ball grid array chip 20. Alternative methods can be used to press the heat sink 30 toward the ball grid array chip 20, without the use of any of the leaf springs 42.

The device 20 that is electrically connected to the printed circuit board 110 can be a ball grid array chip. However, the device 20 is riot required to be a ball grid array chip. The device 20 generates heat, and the generated heat is dissipated by the heat sink 30, the leaf springs 42, the cover 40, the fixing box 10, and other components. If the heat sink 30 is not installed, the leaf springs 42 can press the device 20 toward the substrate 110, and the leaf springs 42 can help to radiate heat away from the device 20.

While the present invention has been illustrated by the description of embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details, representative apparatus and method, and illustrative examples shown and described. Accordingly, departures may be made from such details without departing from the spirit or scope of the applicant's general inventive concept.

What is claimed is:

1. An apparatus, comprising:
   a cover support secured to a substrate;
   a device disposed adjacent to said cover support, said device being electrically connected to the substrate;
   a cover secured to said cover support; and
   a plurality pressing units pressing said device toward the substrate when said cover is secured to said cover support, said pressing units being positioned between said cover and said device, said device being positioned between the substrate and said pressing units;
   said cover having a plurality of apertures formed therein for radiating heat generated by said device.

2. The apparatus of claim 1, said device comprising a ball grid array (BGA) chip.

3. The apparatus of claim 1, said cover support being removably secured to the substrate.

4. The apparatus of claim 1, said cover being removably secured to said cover support.

5. The apparatus of claim 1, said cover support having four side walls and forming at least one aperture, said device being at least partly in said apertures formed by said cover support when said device is electrically connected with the substrate.

6. The apparatus of claim 5, said cover at least partly covering said apertures formed by said cover support when said cover is secured to said cover support.

7. The apparatus of claim 5, further comprising:
   at least one device support installed within said apertures of said cover support, said at least one device support fitting between said cover support and said device to align said device on the substrate, said device being aligned on the substrate when said device is electrically connected to the substrate.

8. The apparatus of claim 1, the substrate comprising a printed circuit board.

9. The apparatus of claim 7, said at least one device support being selected to have a size and shape in dependence upon a size and shape of said device.

10. The apparatus of claim 1, said pressing units including at least one leaf spring, said at least one leaf spring having both ends fixed to said cover, with a central portion of said at least one leaf spring pressing said device to the substrate when said cover is secured to said cover support.

11. The apparatus of claim 10, said at least one leaf spring radiating heat generated by said device.

12. The apparatus of claim 1, said cover support being secured to the substrate with screws.

13. The apparatus of claim 1, said cover being secured to said cover support with screws.

14. The apparatus of claim 1, at least one of said cover support and said cover being formed of a metallic material.

15. An apparatus securing a device to a substrate without soldering, comprising:
   a cover support being removably secured to a substrate and having a plurality of walls comprising an outer perimeter of said cover support;
   a device being at least partly inside the outer perimeter of said cover support and being electrically connected to the substrate;
   a heat sink contacting said device and dissipating heat from said device;
   a cover being secured to said cover support; and
   a plurality of pressing units disposed between said cover and said heat sink when said cover is secured to said cover support, said pressing units pressing said heat sink to said device when said cover is secured to said cover support, said device being positioned between the substrate and said heat sink;
   said cover having a plurality of apertures formed therein for radiating heat generated by said device.

16. The apparatus of claim 15, said device comprising a ball grid array (BGA) chip.

17. The apparatus of claim 15, said cover at least partly covering said the at least one aperture formed by said cover support when said cover is secured to said cover support.

18. The apparatus of claim 15, further comprising:
   at least one device support being at least partly inside the outer perimeter of said cover support, said at least one device support fitting between said cover support and said device to align said device on the substrate, said device being aligned on the substrate when said device is electrically connected to the substrate.

19. The apparatus of claim 18, said at least one device support being removably positioned at least partly inside the outer perimeter of said cover support.

20. The apparatus of claim 18, said at least one device support being selected to have a size and shape in dependence upon a size and shape of said device.

21. The apparatus of claim 15, the substrate comprising a printed circuit board.

22. The apparatus of claim 15, said pressing units including at least one leaf spring, said at least one leaf spring having both ends fixed to said cover, a central portion of said at least one leaf spring pressing a surface of said heat sink when said cover is secured to said cover support.

23. The apparatus of claim 22, said at least one leaf spring radiating heat of said heat sink.

24. The apparatus of claim 15, said cover support being removably secured to the substrate with screws, said cover being removably secured to said cover support with screws.

25. The apparatus of claim 17, at least one of said cover support, said cover, and said device being formed of a metallic material.

26. An apparatus securing a device to a printed circuit board without soldering, comprising:
   a cover support removably secured to a printed circuit board and having a plurality of walls comprising an outer perimeter of said cover support;
   a device disposed inside the outer perimeter of said cover support and being electrically connected to the printed circuit board;
   a heat sink contacting said device and dissipating heat from said device;
   a cover secured to said cover support; and
   a plurality of pressing units disposed between said cover and said heat sink when said cover is secured to said cover support, said pressing units pressing said heat sink to said device when said cover is secured to said cover support said device being positioned between the printed circuit board and said heat sink;
   said cover having a plurality of apertures formed therein for radiating heat generated by said device.

27. The apparatus of claim 26, said device comprising a ball grid array (BGA) chip.

28. The apparatus of claim 27, said cover at least partly covering at least one aperture formed by said cover support when said cover is secured to said cover support.

29. The apparatus of claim 28, further comprising:
   at least one device support disposed at least partly inside the outer perimeter of said cover support, said at least one device support fitting between said cover support and said device to align said device on the printed circuit board, said device being aligned on the printed circuit board when said device is electrically connected to the printed circuit board.

30. The apparatus of claim 29, said at least one device support being removably positioned at least partly inside the outer perimeter of said cover support.

* * * * *